(12) United States Patent
Ker et al.

(10) Patent No.: US 9,001,478 B2
(45) Date of Patent: Apr. 7, 2015

(54) SELF-RESET TRANSIENT-TO-DIGITAL CONVERTOR AND ELECTRONIC PRODUCT UTILIZING THE SAME

(75) Inventors: Ming-Dou Ker, Hsinchu (TW); Cheng-Cheng Yen, Hsinchu (TW); Tung-Yang Chen, New Taipei (TW); Ching-Ling Tsai, Tainan (TW); Shih-Fan Chen, Tainan (TW)

(73) Assignees: National Chiao-Tung University, Hsinchu (TW); Himax Technologies Limited, Tainan (TW)

( * ) Notice: Subject to any disclaimer, the term of this patent is extended or adjusted under 35 U.S.C. 154(b) by 388 days.

(21) Appl. No.: 13/329,033

(22) Filed: Dec. 16, 2011

(65) Prior Publication Data

US 2013/0155566 A1 Jun. 20, 2013

(51) Int. Cl.
*H02H 9/00* (2006.01)
*H03M 1/36* (2006.01)
*G01R 19/00* (2006.01)

(52) U.S. Cl.
CPC .......... *H03M 1/361* (2013.01); *G01R 19/0053* (2013.01)

(58) Field of Classification Search
None
See application file for complete search history.

(56) References Cited

U.S. PATENT DOCUMENTS

| | | | | |
|---|---|---|---|---|
| 5,946,177 A * | 8/1999 | Miller et al. | | 361/56 |
| 7,142,400 B1 * | 11/2006 | Williams et al. | | 361/18 |
| 7,760,476 B2 * | 7/2010 | Riviere et al. | | 361/56 |
| 2009/0231765 A1 * | 9/2009 | Ker et al. | | 361/56 |
| 2010/0328827 A1 * | 12/2010 | Lai et al. | | 361/56 |

* cited by examiner

*Primary Examiner* — Rexford Barnie
*Assistant Examiner* — David Shiao
(74) *Attorney, Agent, or Firm* — Donald E. Stout; Stout, Uxa & Buyan, LLP

(57) ABSTRACT

A self-reset transient-to-digital convertor which includes at least one transient detection circuit is disclosed. The transient detection circuit, coupled between a first power line and a second power line, includes at least one voltage drop unit, a current amplifier unit, and a time control unit. When an ESD event occurs, the voltage drop unit is conducted to pass through an ESD current. The current amplifier unit, coupled between the voltage drop unit and the first power line, is conducted by the ESD current to set the level of a first node. The time control unit, coupled between the first node and the second power line, is configured to gradually drain the ESD current away. Wherein, each of the transient detection circuit generates a digital code according to the level of the first node.

15 Claims, 6 Drawing Sheets

SELF-RESET TRANSIENT-TO-DIGITAL CONVERTOR AND ELECTRONIC PRODUCT UTILIZING THE SAME

BACKGROUND OF THE INVENTION

1. Field of the Invention

The present invention generally relates to a transient-to-digital convertor, and more particularly to a transient-to-digital convertor generating digital codes according to an electrostatic discharge (ESD) pulse.

2. Description of Related Art

An electrostatic discharge (ESD) event is an important reliability issue for integrated circuits (ICs). ESD protection is also a critical reliability issue for ICs. As semiconductor processes advance toward deep sub-micron manufacturing, scaled-down devices and thinner gate oxides are more vulnerable to ESD stress. Generally, the IC chips must have the ability to withstand certain levels of ESD of high stress in machine mode (MM) or in human body mode (HBM). The issues result from strict reliability test standard requirements, such as system-level ESD tests.

The additional noise filter networks, such as the decoupling capacitor, transient voltage suppressor (TVS), and/or current-limiting resistance, are often used to improve the system-level ESD immunity of microelectronic products. The system-level ESD immunity of CMOS ICs under system-level ESD test can be significantly enhanced by choosing proper noise filter networks. However, the additional discrete noise-bypassing components substantially increase the total cost of microelectronic products. Therefore, a need has arisen by IC industry to propose a novel chip-level solution which meets high system-level ESD specification for microelectronic products without additional discrete noise-decoupling components on the microelectronic products.

SUMMARY OF THE INVENTION

In view of the foregoing, it is an object of the present invention to provide an on-chip transient-to-digital convertor which outputs digital codes corresponding to different ESD voltages without additional discrete noise-bypassing components, and executes an auto-recovery procedure in microelectronic systems based on RC delay effect after detecting an ESD pulse, which achieves decreased cost.

According to one embodiment, a self-reset transient-to-digital convertor which includes at least one transient detection circuit is disclosed. The transient detection circuit, coupled between a first power line and a second power line, includes at least one voltage drop unit, a current amplifier unit, and a time control unit. When an ESD event occurs, the voltage drop unit is conducted to pass through an ESD current. The current amplifier unit, coupled between the voltage drop unit and a first node, is conducted by the ESD current to set the level of the first node. The time control unit, coupled between the first node and the second power line, is configured to gradually drain the ESD current away. Wherein, each of the transient detection circuit generates a digital code according to the level of the first node.

According to another embodiment, an electronic product which includes at least one transient-to-digital convertor is disclosed. The transient-to-digital convertor includes at least one transient detection circuit which is coupled between a first power line and a second power line. The transient detection circuit includes at least one voltage drop unit, a current amplifier unit, and a time control unit. When an ESD event occurs, the voltage drop unit is conducted to pass through an ESD current. The current amplifier unit, coupled between the voltage drop unit and a first node, is conducted by the ESD current to set the level of the first node. The time control unit, coupled between the first node and the second power line, is configured to gradually drain the ESD current away. Wherein, each of the transient detection circuit generates a digital code according to the level of the first node.

DETAILED DESCRIPTION OF THE INVENTION

Figure 1:
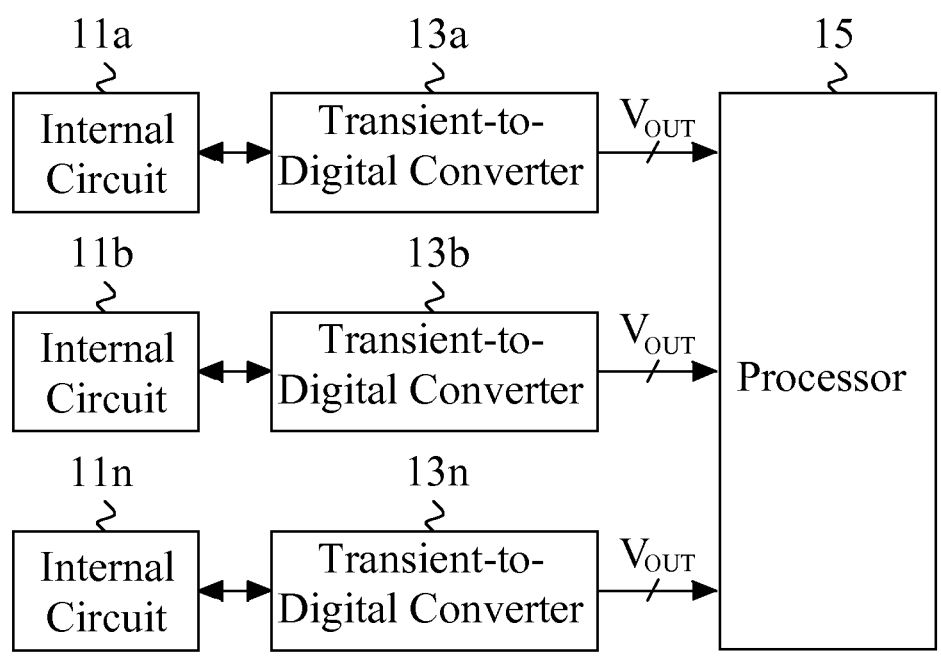
FIG. 1 illustrates an electronic product according to one embodiment of the present invention.

Firstly, FIG. 1 illustrates an electronic product 1 according to one embodiment of the present invention. As shown in FIG. 1, the electronic product 1 includes a plurality of internal circuits 11a-11n, a plurality of transient-to-digital convertors 13a-13n, and a processor 15. The transient-to-digital convertors 13a-13n, coupled with the internal circuits 11a-11n respectively, are configured to detect whether an ESD event occurs in the internal circuits 11a-11n and accordingly generate the digital code $V_{OUT}$. In one embodiment, the transient-to-digital convertors 13a-13n may be integrated in the CMOS chips of the internal circuits 11a-11n. The processor 15, coupled to the transient-to-digital convertors 13a-13n, receives the generated digital code $V_{OUT}$ to determine whether the ESD event occurs in the corresponding internal circuits 11a-11n. Specifically, the internal circuits 11a-11n may be single chips, timing controllers, driving circuits, or the combination thereof.

Figure 2:
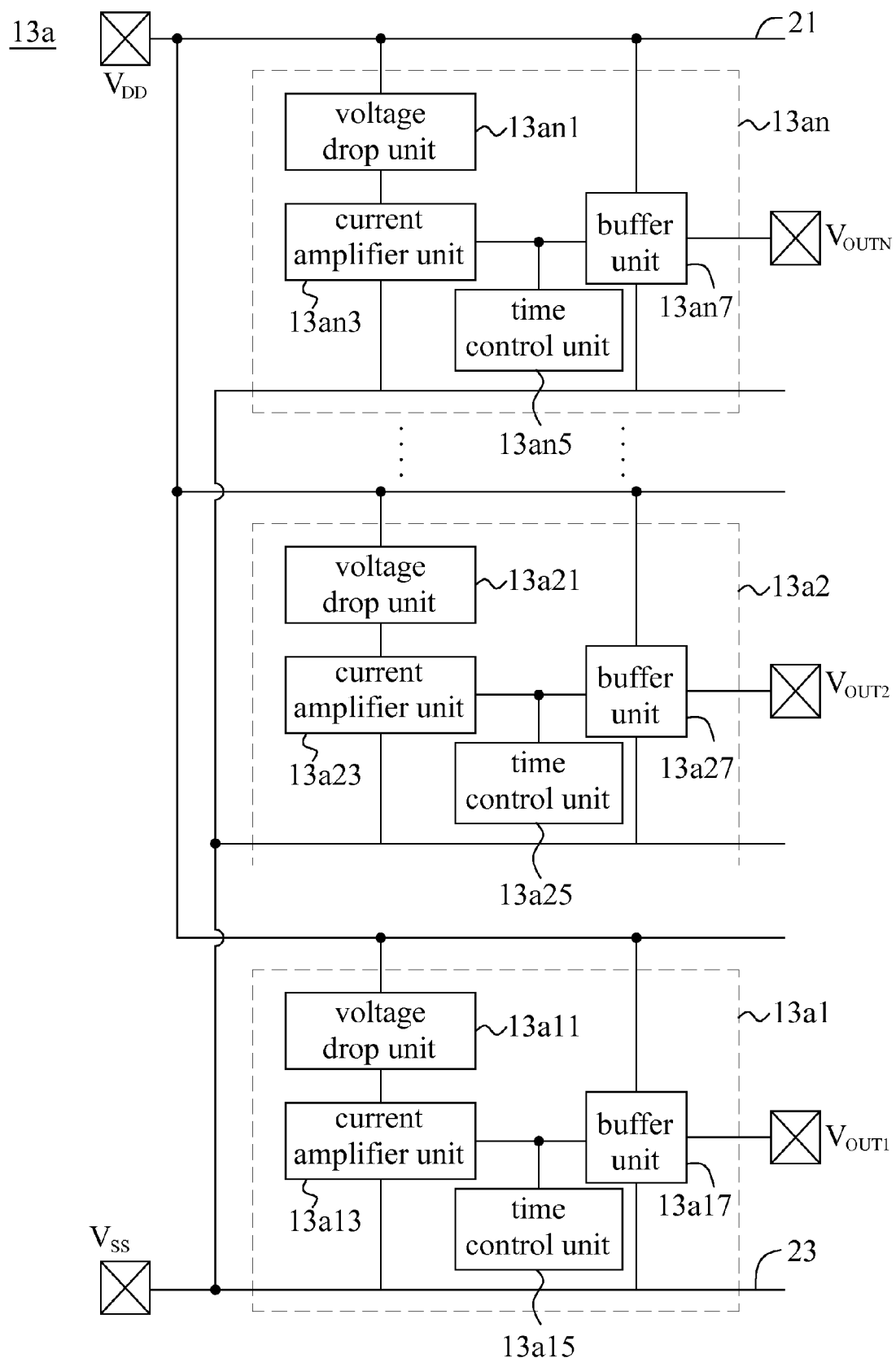
FIG. 2 illustrates a transient-to-digital convertor according to one embodiment of the present invention.

Afterwards, FIG. 2 illustrates a transient-to-digital convertor according to one embodiment of the present invention. Taking the transient-to-digital convertor 13a for example, it includes a plurality of transient detection circuits 13a1-13an, and each of them couples between a first power line (voltage source VDD) 21 and a second power line (ground VSS) 23. When an ESD event occurs in the first power line 21, the transient detection circuits 13a1-13an generate digital codes $V_{OUT1}$-$V_{OUTN}$ according to amplitude of an ESD pulse generated by the ESD event.

Figure 3:
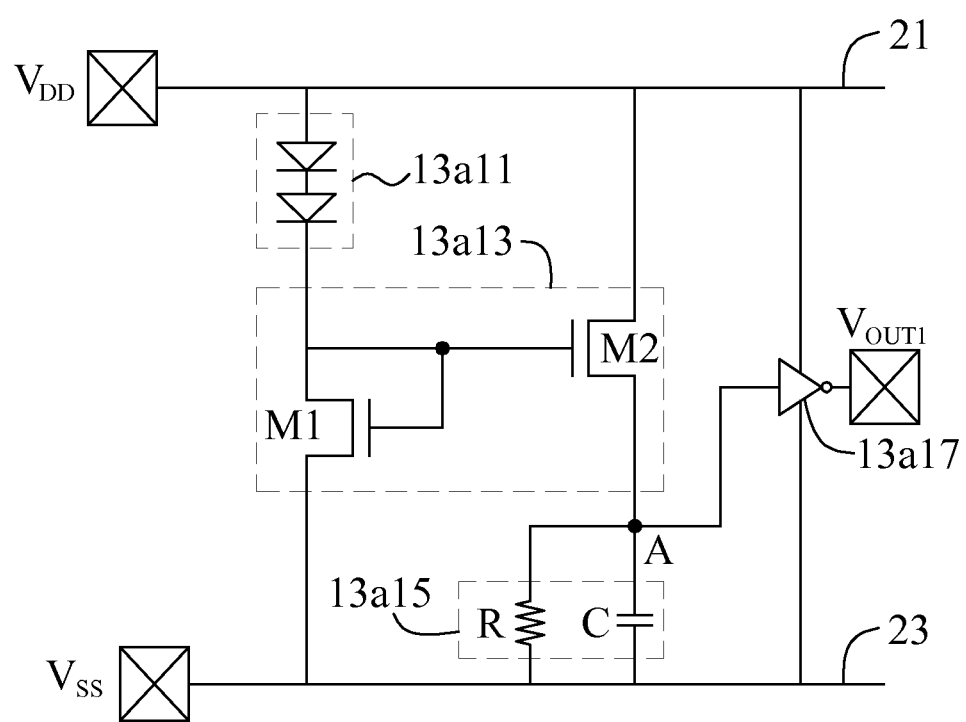
FIG. 3 illustrates a transient detection circuit according to one embodiment of the present invention.

FIG. 3 illustrates a transient detection circuit according to one embodiment of the present invention. Taking the transient detection circuit 13a1 for example, it includes a voltage drop unit 13a11, a current amplifier unit 13a13, a time control unit 13a15, and a buffer unit 13a17. When the ESD event occurs in the first power line 21, the voltage drop unit 13a11 is conducted to pass through an ESD current. The current amplifier unit 13a13, coupled between the voltage drop unit 13a11 and a first node A, is conducted by the ESD current to set the level of the first node A. In one embodiment, the voltage drop unit 13a11 includes two diodes connected to which in serial. The current amplifier unit 13a13 includes a first transistor M1 and a second transistor M2, wherein the first transistor M1 is coupled between the voltage drop unit 13a11 and the second power line 23, and the second transistor M2 is coupled between the first power line 21 and the first node A. The gate of the second transistor M2 is connected to the gate of the first transistor M1. The voltage drop unit 13a11 may be configured between the current amplifier unit 13a13 and the first power line 21, and/or between the current amplifier unit 13a13 and the second power line 23.

Assume that the level of the first node A is 0 (low level) in regular operation (no ESD event occurs). Once the ESD voltage generated by the ESD event is large enough to conduct the diodes of the voltage drop unit 13a11, the second transistor M2 is activated, so that the ESD current is directed into the first node A to change the level of the first node A from 0 (low level) to 1 (high level).

The time control unit 13a15, coupled between the first node A and the second power line 23, includes a resistor R and a capacitor C, where the resistor R is coupled between the first node A and the second power line 23, and the capacitor C is connected to the resistor R in parallel. At first, the capacitor C of the time control unit 13a15 may be charged because the ESD current is directed into the first node A, so as to change the level of the first node A from 0 to 1. Then, based on the nature delay time constant of RC circuits, the resistor R can gradually drain the ESD current to the second power line 23, so as to reset the level of the first node A to 0 automatically.

A user can obtain, whether an ESD event occurs according to the level of the first node A. Alternatively, in this embodiment, the buffer unit 13a17, coupled to the first node A, can be used to process the level of the first node A for increasing the driving function of the level of the first node A. The processed result serves as a digital code $V_{OUT1}$. Specifically, the buffer unit 13a17 includes an inverter for inverting the level of the first node A and providing the inverted result to serve as the digital code $V_{OUT1}$. In another embodiment, the buffer unit 13a17 may include several inverters or be omitted.

Figure 4:
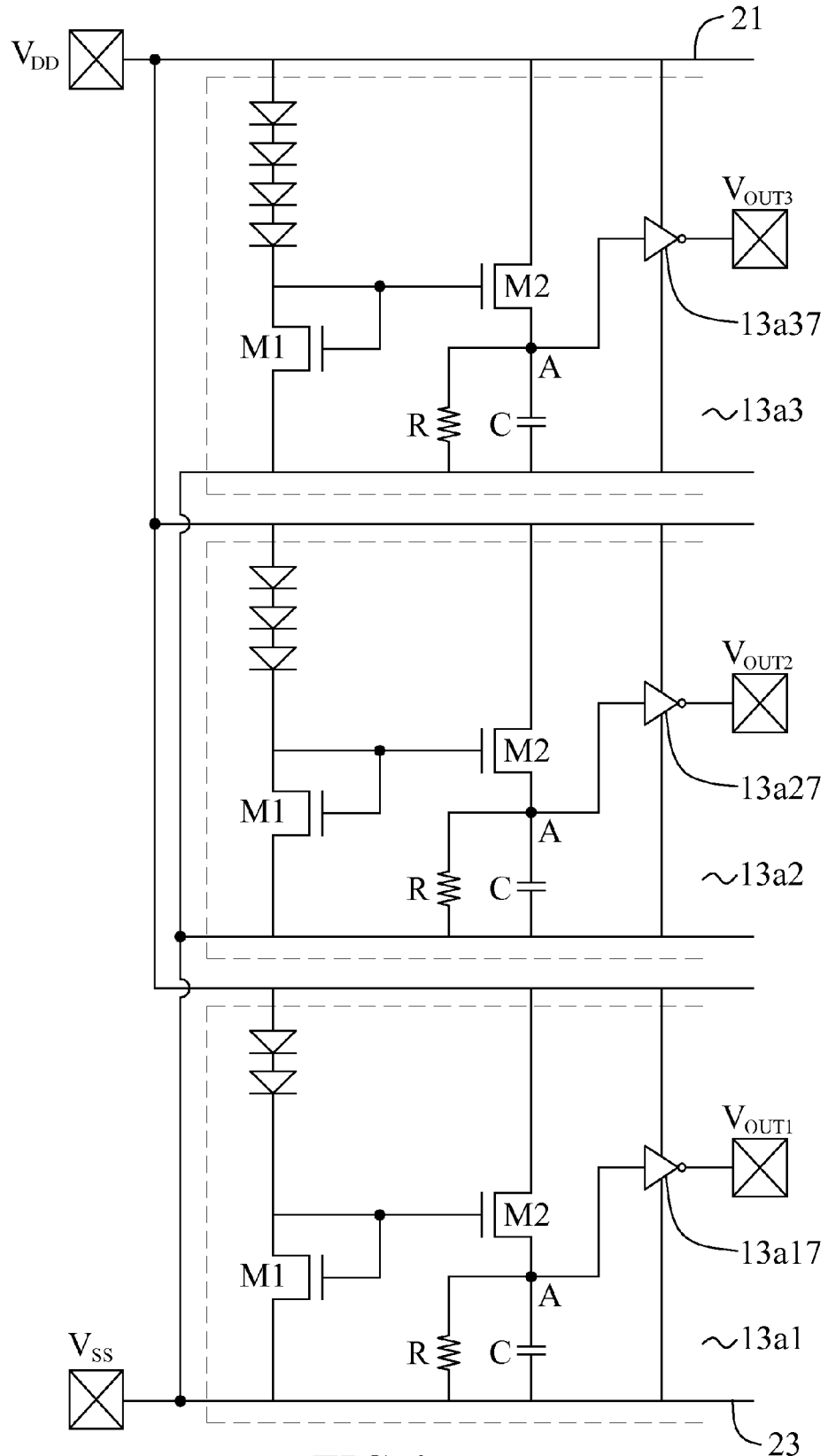
FIG. 4 illustrates a 3-bit transient-to-digital convertor according to one embodiment of the present invention.
Figure 5A:
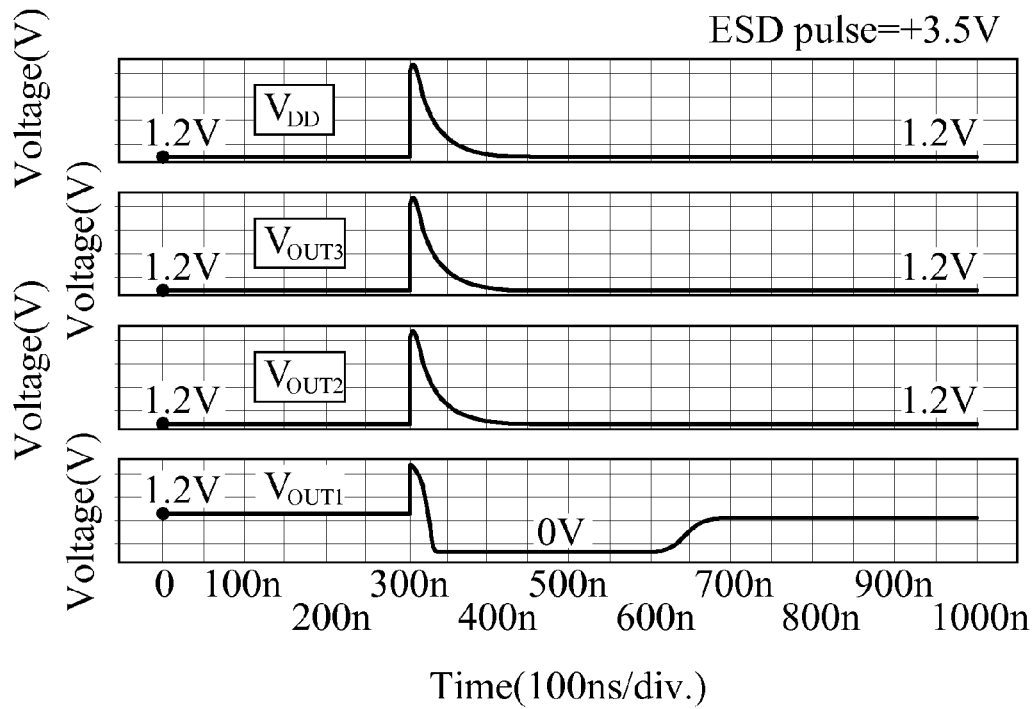
FIGS. 5a-5c illustrate the digital codes according to one embodiment of the present invention.

The transient-to-digital convertor 13a having only one transient detection circuit 13a1 (1-bit transient-to-digital convertor) merely can indicate or warn whether an ESD event occurs. In some cases, plural transient detection circuits may be configured in the transient-to-digital convertor 13a to determine the level of the ESD pulse generated by the ESD event. FIG. 4 illustrates a 3-bit transient-to-digital convertor according to one embodiment of the present invention. As shown in FIG. 4, the transient-to-digital convertor 13a includes three transient detection circuits 13a1-13a3 with different ESD abilities, respectively. The digital codes outputted by the transient-to-digital convertor 13a correspond to different ESD voltages. Specifically, the voltage drop unit 13a11-13a31 in the transient detection circuits 13a1-13a3 have two, three, and four diodes, respectively, for withstanding different amplitudes of the ESD pulse. For example, when the amplitude of the ESD pulse is 3.5V, only the voltage drop unit 13a11 is conducted, so that the level of the digital code $V_{OUT1}$ is changed to 0, and the levels of the digital codes $V_{OUT2}$, $V_{OUT3}$ are still 1, as shown in FIG. 5A, the digital codes outputted by the transient-to-digital convertor 13a can be referred to as "110." Based on delay time constant, the resistor IR of the time control unit 13a15 then gradually drains the ESD current at the first node A away to reset the level of the first node A to 0 automatically, so as to operate with regular voltage.

Figure 5B:
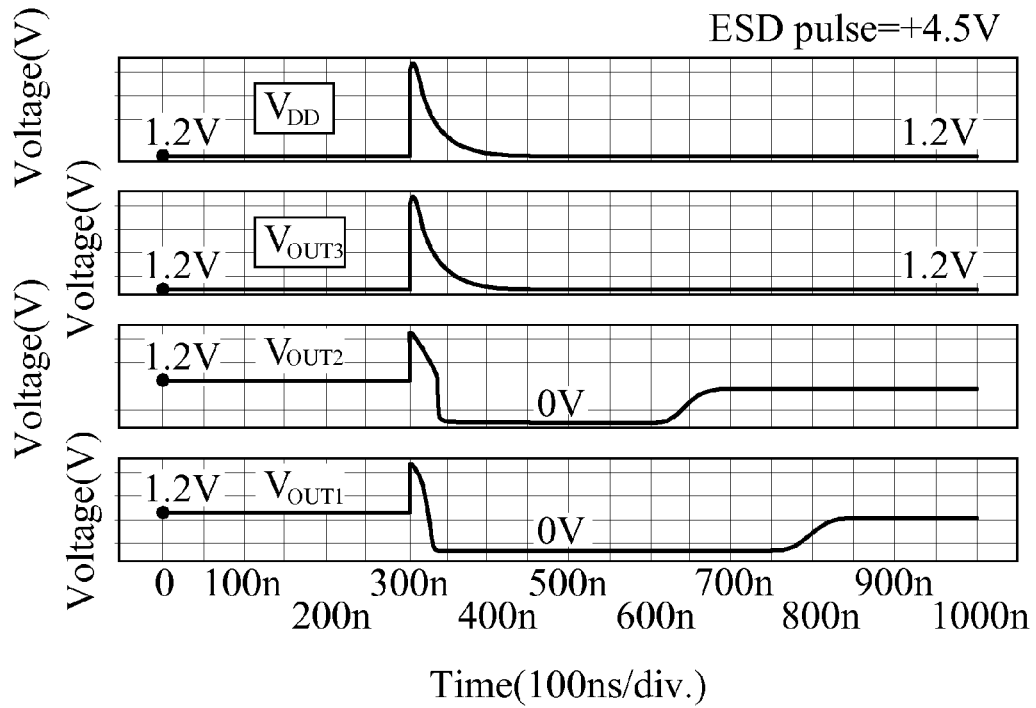
Figure 5C:
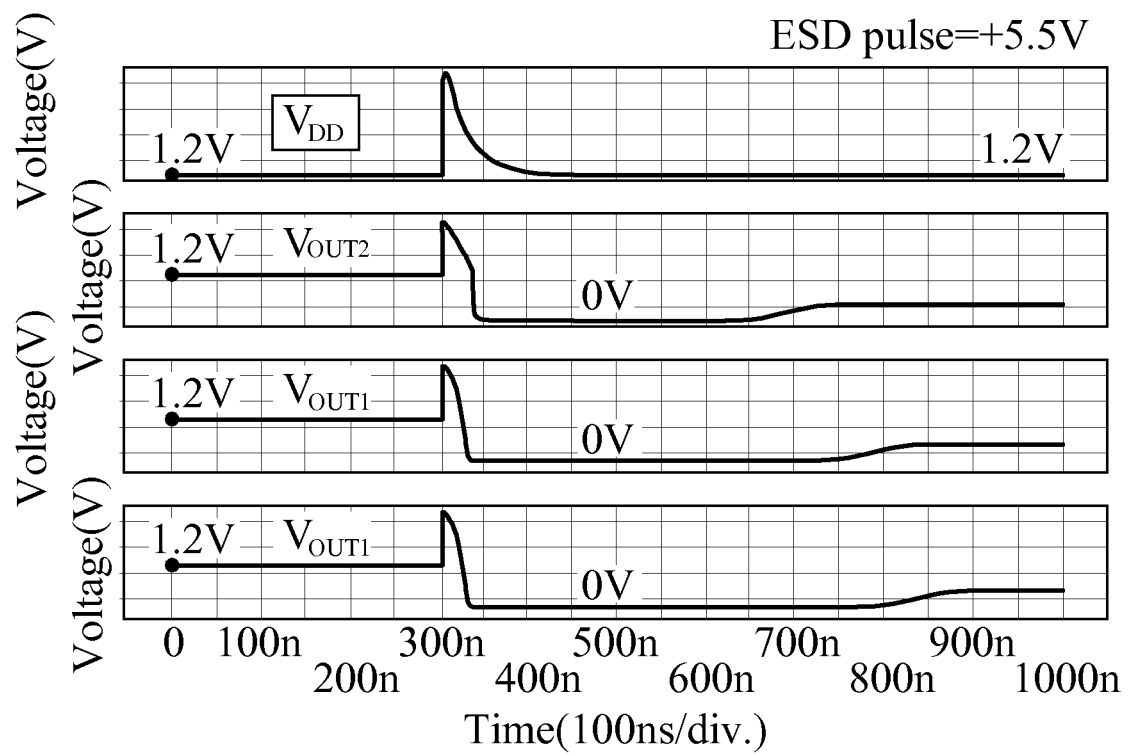

Similarly, if generating more ESD pulse such as 4.5V which is large enough to conduct the three diodes of the voltage drop unit 13a21, the levels of the digital codes $V_{OUT1}$, $V_{OUT2}$ are changed to 0, and the level of the digital code $V_{OUT3}$ is still 1, as shown in FIG. 5B, the digital codes outputted by the transient-to-digital convertor 13a can be referred to as "100." Based on delay time constant, the resistors R of the time control units 13a15, 13a25 then gradually drain the ESD current at the first nodes A away respectively, so as to reset the levels of the first nodes A to 0 automatically. If further generating more ESD pulse such as 5.5V which is large enough to conduct the four diodes of the voltage drop unit 13a31, the levels of all the digital codes $V_{OUT1}$-$V_{OUT3}$ are changed to 0, as shown in FIG. 5C, the digital codes outputted by the transient-to-digital convertor 13a can be referred to as "000." The time control units 13a15-13a35 then drain the ESD current at the first nodes A away respectively, so as to operate with regular voltage. Due to the factor that the number of the diodes included in the voltage drop units 13a11-13a31 of the transient-to-digital convertor 13a is directly proportional to the detected ESD pulse, so the outputted digital codes can be used to determine the level of the ESD pulse generated by the ISD event.

The processor 15 receives the generated digital codes $V_{OUT1}$-$V_{OUT3}$ and accordingly to execute a specific action. Specifically, by providing a hardware/firmware co-design, it indicates that the ESD pulse generated by the ESD event exceeds a preset value when the level of the digital codes $V_{OUT3}$ is changed to 0, then the processor 15 executes total system auto-recovery for the internal circuit where that ESD event occurs. In opposition, it indicates that the ESD pulse generated by the ESD event is smaller than the preset value if only the level of the digital codes $V_{OUT1}$ is changed to 0, the processor 15 executes partial system auto-recovery for the internal circuit where that ESD event occurs. Therefore, the hardware/firmware co-design with the transient-to-digital convertor 13a can improve the immunity of CMOS IC products against electrical transient disturbance.

According to the above embodiment, the self-reset transient-to-digital convertor and electronic product utilizing the same, provided in the present invention, convert the transient voltage into the digital codes to detect whether an ESD event occurs. Therefore, when the ESD event occurs, it can issue a protect/warn signal without additional discrete noise-bypassing components. Furthermore, the present invention utilizes plural transient detection circuits with different level of converting to determine the level of the ESD pulse generated by the ESD event according to the outputted digital codes. The present invention also bypasses transient voltages or currents by RC circuit to reset to regular voltage automatically. So that the traditional reset hardware/firmware may be omitted, which achieves decreased cost.

Although specific embodiments have been illustrated and described, it will be appreciated by those skilled in the art that various modifications may be made without departing from the scope of the present invention, which is intended to be limited solely by the appended claims.

What is claimed is:

1. A self-reset transient-to-digital convertor, comprising:
at least one transient detection circuit coupled between a first power line and a second power line, comprising:
at least one voltage drop unit configured to be conducted to pass through an ESD current when an ESD event occurs;
a current amplifier unit coupled between the voltage drop unit and a first node, wherein the current amplifier unit is conducted by the ESD current to set the level of the first node, and the current amplifier unit comprises:
a first transistor coupled between the voltage drop unit and the second power line; and
a second transistor coupled between the first power line and the first node, and the gate of the second transistor is directly connected to the gate of the first transistor; wherein, once the voltage drop unit is conducted, the second transistor is activated to direct the ESD current into the first node; and a time control unit coupled between the first node and the second power line and configured to gradually drain the ESD current away;

wherein, each of the transient detection circuits generate a digital code according to the level of the first node.

2. The self-reset transient-to-digital convertor of claim 1, wherein the time control unit comprises:

a resistor coupled between the first node and the second power line to gradually drain the ESD current to the second power line, so as to reset the level of the first node automatically; and a capacitor connected to the resistor in parallel.

3. The self-reset transient-to-digital convertor of claim 1, wherein the voltage drop unit comprises at least one diode.

4. The self-reset transient-to-digital convertor of claim 3, further comprising:

a buffer unit, coupled to the first node, configured to process the level of the first node to output the digital code.

5. The self-reset transient-to-digital convertor of claim 4, wherein the buffer unit comprises at least one inverter for inverting the level of the first node and providing the inverted result to serve as the digital code.

6. The self-reset transient-to-digital convertor of claim 4, wherein the number of the transient detection circuit is more than 1, and the digital codes generated by the transient detection circuits are used to determine the level of an ESD pulse generated by the ESD event.

7. The self-reset transient-to-digital convertor of claim 6, wherein the number of the diodes included in the voltage drop units is directly proportional to the level of the detected ESD pulse.

8. An electronic product, comprising:

at least one transient-to-digital convertor, comprising:

at least one transient detection circuit coupled between a first power line and a second power line, comprising:

at least one voltage drop unit configured to be conducted to pass through an ESD current when an ESD event occurs;

a current amplifier unit coupled between the voltage drop unit and a first node, wherein the current amplifier unit is conducted by the ESD current to set the level of the first node, and wherein the current amplifier unit comprises:

a first transistor coupled between the voltage drop unit and the second power line; and a second transistor coupled between the first power line and the first node, and the gate of the second transistor is directly connected to the gate of the first transistor;

wherein, once the voltage drop unit is conducted, the second transistor is activated to direct the ESD current into the first node; and a time control unit coupled between the first node and the second power line and configured to gradually drain the ESD current away;

wherein, each of the transient detection circuits generate a digital code according to the level of the first node.

9. The electronic product of claim 8, further comprising:

at least one internal circuit, wherein each of the transient-to-digital convertor is coupled with each of the internal circuit; and a processor unit, coupled to the transient-to-digital convertor, configured to receive the generated digital code to determine whether the ESD event occurs in the corresponding internal circuit, and accordingly to execute a specific action.

10. The electronic product of claim 9, wherein the specific action comprises the operation of partial or total system auto-recovery for the internal circuit where the ESD event occurs.

11. The electronic product of claim 8, wherein the voltage drop unit comprises at least one diode.

12. The electronic product of claim 11, wherein the transient detection circuit further comprises:

a buffer unit, coupled to the first node, configured to process the level of the first node to output the digital code.

13. The electronic product of claim 12, wherein the number of the transient detection circuit is more than 1, and the digital codes generated by the transient detection circuits are used to determine the level of an ESD pulse generated by the ESD event.

14. The electronic product of claim 13, wherein the number of the diodes included in the voltage drop units is directly proportional to the level of the detected ESD pulse.

15. The electronic product of claim 9, wherein the internal circuit is a single chip, a timing controller or a driving circuit.

* * * * *